US010298243B2

(12) United States Patent
Mayer (10) Patent No.: US 10,298,243 B2
(45) Date of Patent: May 21, 2019

(54) SYSTEM AND A METHOD FOR DETERMINING A CORRECTION FOR AN OUTPUT VALUE OF A TIME-TO-DIGITAL CONVERTER WITHIN A PHASE-LOCKED LOOP (71) Applicant: Intel IP Corporation, Santa Clara, CA (US)

(72) Inventor: Thomas Mayer, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/575,830

(22) PCT Filed: Jun. 8, 2016

(86) PCT No.: PCT/IB2016/053359
§ 371 (c)(1),
(2) Date: Nov. 21, 2017

(87) PCT Pub. No.: WO2016/207758
PCT Pub. Date: Dec. 29, 2016

(65) Prior Publication Data
US 2018/0131380 A1 May 10, 2018

(30) Foreign Application Priority Data
Jun. 26, 2015 (DE) .......................... 10 2015 110 293

(51) Int. Cl.
*H03L 7/06* (2006.01)
*H03L 7/099* (2006.01)
(Continued)

(52) U.S. Cl.
CPC ............ *H03L 7/0992* (2013.01); *H03L 7/091* (2013.01); *H03L 7/197* (2013.01); *H04B 1/02* (2013.01)

(58) Field of Classification Search
CPC ....... H03L 7/0992; H03L 7/091; H03L 7/197; H03L 7/0891; H03L 7/18; H03L 7/093;
(Continued)

(56) References Cited
U.S. PATENT DOCUMENTS 9,628,094 B2 * 4/2017 Lotfy ...................... H03L 7/085
2006/0055466 A1 * 3/2006 Hirano ................. H03C 3/0925
331/16
(Continued)

FOREIGN PATENT DOCUMENTS

EP       1458101 A1    3/2003
WO    2008072851 A1    6/2008
WO    2015047280 A1    4/2015

OTHER PUBLICATIONS

Samarah, A.; Carusone, A.C.: "A Digital Phase-Locked Loop With Calibrated Coarse and Stochastic Fine TDC". In: Solid-State Circuits, IEEE Journal of, vol. 48, No. 8, 1829-1941, Aug. 2013.
(Continued)

Primary Examiner — Long Nguyen
(74) Attorney, Agent, or Firm — 2SPL Patentanwälte PartG mbB; Mani Arabi (57) ABSTRACT A system for determining a correction for an output value of a time-to-digital converter within a phase-locked loop is provided. The output value relates to a time difference between an input signal and a reference signal supplied to the time-to-digital converter. The system includes a digitally-controlled oscillator configured to generate a first signal independently from the output signal. The first signal has a first frequency different from an integer multiple of a reference frequency of the reference signal. The system further includes a frequency divider configured to generate the input signal for the time-to-digital converter based on the first signal. The input signal has a second frequency being a fraction of the first frequency. Further, the system includes
(Continued)

a processing unit configured to calculate the correction using a distribution of output values of multiple time differences.

20 Claims, 6 Drawing Sheets

(51) Int. Cl.
*H03L 7/197* (2006.01)
*H03L 7/091* (2006.01)
*H04B 1/02* (2006.01)

(58) Field of Classification Search
CPC ........... H03L 7/095; H03L 7/087; H04B 1/02; H03K 19/00315; H03K 19/00361; H03K 19/0013
See application file for complete search history.

(56) References Cited

U.S. PATENT DOCUMENTS

| | | |
|---|---|---|
| 2009/0267664 A1 | 10/2009 | Uozumi et al. |
| 2012/0249195 A1 | 10/2012 | Guo et al. |
| 2013/0002317 A1 | 1/2013 | Frantzeskakis et al. |
| 2013/0223564 A1* | 8/2013 | Mayer ............... H04L 25/03343 375/296 |
| 2013/0278303 A1 | 10/2013 | Chen et al. |

OTHER PUBLICATIONS

Ravi, A.; Pellerano, S.; Omeias, C.; Lakdawala, H.; Tetzlaff, T.; Degani, O.; Saledleh, M.: Sournyanath, K.: "A 9.2-12GHz, 90nm digital fractional-N synthesizer with stochastic TDC calibration and −35/41dBc integrated phase noise in the 5/2.5GHz bands". In: VLSI Circuits (VLSIC), 2010 IEEE Symposium on, pp. 143-144, Jun. 16-18, 2010.

* cited by examiner

SYSTEM AND A METHOD FOR DETERMINING A CORRECTION FOR AN OUTPUT VALUE OF A TIME-TO-DIGITAL CONVERTER WITHIN A PHASE-LOCKED LOOP

FIELD

Examples relate to correcting a nonlinearity of a time-to-digital converter in a phase-locked loop. In particular, examples relate to a system and a method for determining a correction for an output value of a time-to-digital converter within a phase-locked loop. Some examples relate to a system and a method for modifying an output value of a time-to-digital converter within a phase-locked loop.

BACKGROUND

In a Phase-Locked Loop (PLL), a Time-to-Digital Converter (TDC) is used to detect a phase difference between a reference signal and an output signal provided by a digitally-controlled oscillator (DCO) of the PLL. A control signal for the DCO is provided by the TDC based on the detected phase difference. A nonlinearity of the TDC may cause noise in the control signal for the DCO. Hence, a quality of the DCO's output signal may be degraded. The noise generated by the TDC may be dominant compared to quantization noise generated by a frequency divider of the PLL used for controlling a ratio of a frequency of the output signal to a frequency of the reference signal. However, since the output of the TDC is a digital signal, a correction for the TDC's nonlinearity may be applied by means of digital processing circuits. For example, a look-up table with correction values may be used to correct the output of the TDC. However, the digital correction of the TDC's nonlinearity requires precise knowledge about the nonlinearity of the TDC.

Conventional approaches use a closed loop mode of the PLL for determining correction values for the output of the TDC. However, the determined correction values are influenced by a transfer function of the closed loop. Hence, there may be a desire for an improved determination of a correction for an output value of a TDC within a PLL.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Figure 1:
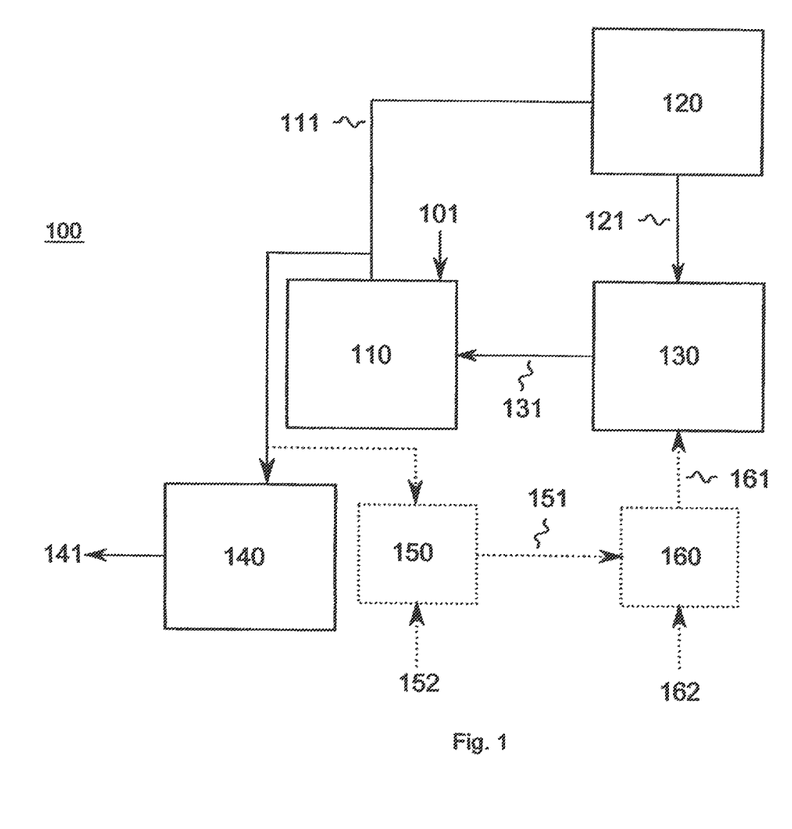
FIG. 1 illustrates an example of a system for determining a correction for an output value of a TDC within a PLL.

FIG. 1 illustrates an example of a system 100 for determining a correction 141 for an output value 111 of a TDC 110 within a PLL. The output value 111 is related to a time difference between an input signal 131 and a reference signal 101 supplied to the TDC 110. For determining the correction 141, the PLL is operated in a calibration mode (a first mode of operation). Once the correction 141 for the output value 111 is determined, the PLL may be operated in a regular mode (a second mode of operation, e.g., illustrated in FIG. 5).

The system 100 comprises a DCO 120. In regular mode, the DCO 120 is controlled by the output value 111 or a signal related to the output value 111 (e.g. a loop filter may provide a control signal based on the output value 111 to the DCO). That is, the DCO 120 generates a (second) signal depending on the output value 111. In the calibration mode illustrated in FIG. 1, the DCO 120 generates a first signal 121 independently from the output value 111 and provides the first signal 121 to a frequency divider 130. The first signal 121 has a first frequency which is different from an integer multiple of a reference frequency of the reference signal 101 supplied to the TDC 110. The reference signal 101 is used by the TDC 110 for determining a phase relation (time difference) between the input signal 131 and the reference signal 101 in order to control the DCO 120. Assuming that the reference frequency of the reference signal 101 is $f_{REF}$, the frequency of the first signal 121 may, e.g., be $1.9*f_{REF}$, $2.04*f_{REF}$, $8.6*f_{REF}$, $17.2*f_{REF}$, $143.99*f_{REF}$, $189.001*f_{REF}$ or $256.96*f_{REF}$.

The frequency divider 130 generates the input signal 131 based on the first signal 121. The input signal 131 has a second frequency which is a fraction of the first frequency of the first signal 121. For example, the frequency divider 130 may comprise a multi-modulus divider to select a ratio of the second frequency to the first frequency.

The input signal 131 is supplied to the TDC 110. The TDC 110 compares a phase of the input signal 131 to a phase of the reference signal 101, i.e., the TDC 110 determines a time difference between the input signal 131 and the reference signal 101. Based on the phase relation between the input signal 131 and the reference signal 101, the TDC 110 provides the output value 111. The output value 111 is a digital representation of the determined time difference.

The system 100 illustrated in FIG. 1 is operated in an open loop mode since the DCO 120 provides the first signal 121 independently from the output value 111, i.e., a possibly present control loop is not enabled. The first frequency of the first signal 121 is a non-integer multiple of the reference frequency of the reference signal 101 but the phase of the first signal 121 is not locked to the phase of the reference signal 101, i.e., the phase of the first signal 121 is independent from the phase of the reference signal 101. Due to the frequency difference of the first frequency of the first signal 121 to an integer multiple of the reference frequency of the reference signal 101, a phase difference (time difference) between the first signal 121 and the reference signal 101 changes over time. For example, the phase difference changes approximately linearly over time. Accordingly, also a phase difference between the input signal 131 and the reference signal 101 changes since the input signal 131 is based on the first signal 121. For an increasing frequency difference of the first frequency of the first signal 121 to an integer multiple of the reference frequency of the reference signal 101, the phase difference between the input signal 131 and the reference signal 101 may change more rapidly.

A substantially uniform distribution of the phase differences (time differences) is provided to the TDC 110, i.e., each phase difference is provided to the TDC 110 with a substantially equal abundance. A distribution of output values of multiple determined time differences is substantially uniform, if the TDC 110 was perfectly linear. That is, each of the output values for the multiple time differences determined by the TDC 110 would have a substantially equal abundance. Accordingly, a deviation from the uniform distribution of the output values 111 of the TDC 110 is related to the TDC 110's nonlinearity.

The processing unit 140 calculates the correction 141 using the distribution of the output values of the multiple determined time differences. For example, the processing unit 140 may collect the distribution of the output values in bins of a histogram (e.g. by counting a number of occurrences of the various output values 111 for the determined time differences). The bins may correspond to a predetermined range of the output values. For example, a nonlinear TDC 110 may cause a higher number of occurrences of output values related a greater time difference (phase difference) and a lower number of occurrences of output values related to a smaller time difference (phase difference). Hence, the histogram may show a Differential Nonlinearity (DNL) of the TDC 110. DNL describes the deviation of a quantization stage from an ideal value. For an ideal linear TDC, all quantization stages should have the same time lag. The deviation of a time lag of a single quantization stage from the ideal time lag is denoted as the DNL of a TDC.

For determining the correction for the output value 111, the processing unit 140 may, e.g., comprise an integrator which integrates contents of bins of the histogram. That is, the processing unit 140 may determine the Integral Nonlinearity (INL) of the TDC 110 by integrating the DNL. The INL describes the actual deviation of a quantized value from an ideal value. For an ideal quantization, the time lag between subsequent samples is the same for all samples. Hence, a line connecting all the samples is a straight line. However, for a nonlinear quantization, the time lag between subsequent samples varies, so that the samples have an offset to the straight line determined by the samples of the ideal quantization. Hence, the INL describes the distance of the single sample to the ideal straight line. Accordingly, the INL may be used to correct the output value 111 provided by the nonlinear TDC 110. For example, the INL may be stored in a loop-up table as correction value. A signal correction unit may be provided between the TDC 110 and the DCO 120 to modify the output value 111 by the correction value in order to provide a corrected output value to the DCO 120.

The system 100 may allow to determine the nonlinearity of a TDC with high accuracy. Since the system 100 is operated in an open loop mode, transfer characteristics of the PLL (e.g. of a loop filter within the PLL) do not influence the correction. Accordingly, the system may allow to determine a correction for the output signal of the TDC which is merely related to the nonlinearity of the TDC. Hence, a correction value determined according to the proposed concept may allow to reduce noise related to the TDC's nonlinearity in the control signal for the DCO more precisely. For example, during regular mode operation of the PLL (i.e. the DCO generates a second signal depending on the output value, and the frequency divider generates the input signal for the TDC based on the second signal with a second frequency that is a fraction of the frequency of the second signal), a correction unit may be connected to the TDC. The correction unit may modify an output value represented by the output signal of the TDC (being a control signal for the DCO) by a correction determined in the calibration mode (e.g. add or subtract the correction to/from the output value represented by the output signal of the TDC). For example, the correction may be stored in a look-up table in the calibration mode and may be provided to the correction unit in the regular mode. Accordingly, a corrected control signal for the DCO may be provided, so that a noise component in the control signal for the DCO may be reduced. Hence, the DCO may provide a signal (e.g. a radio frequency signal) of high quality. That is, a system for modifying an output value of a TDC within a PLL may be provided in some examples.

In some examples, the frequency divider 130 may be configured to select or alter a ratio of the second frequency (of the input signal 131) to the first frequency (of the first signal 121) based on a control signal 161. The control signal 161 for the frequency divider 130 may be based on the output value 111 of the TDC 110. For example, the system 100 may optionally comprise a comparator 150 which compares the output value 111 to a threshold 152. The comparator may provide a comparison result 151 to a signal modification unit 160. The signal modification unit 160 may modify a constant signal 162 based on the comparison result 151 to provide the control signal 161. The constant signal 162 may have a signal shape which is constant over time (e.g. the constant signal may constantly indicate a same digital value over time).

Providing the control signal 161 based on the output value 111 of the TDC 110 may allow to provide merely time differences (phase differences) between the reference signal 101 and the input signal 131 within a defined range. As described above, the control signal 161 may be modified based on a comparison of the output value 111 to the threshold 152. For example, a value represented by the constant signal 162 may be modified by an offset value if the output value 111 exceeds the threshold 152. The value represented by the constant signal 162 may indicate (to the frequency divider 130) a desired ratio of the second frequency to the first frequency. In some examples, the value represented by the constant signal 162 may be modified by an offset value if the output value 111 falls below the threshold 152. For example, the value represented by the constant signal 162 may be modified for an oscillation period of the input signal 131 (i.e. for the oscillation period of the second frequency). Accordingly, the second frequency of the input signal 131 is modified for this period by the frequency divider 130 (e.g. the frequency is increased or reduced), so that the time difference (phase difference) between the reference signal 101 and the input signal 131 provided to the TDC 110 may be reduced by one or more oscillation periods of the first signal. Hence, the time difference (phase difference) between the reference signal 101 and the input signal 131 may be kept within a defined range.

As discussed above, the phase difference between the input signal 131 and the reference signal 101 may change more rapidly for an increasing frequency difference of the first frequency of the first signal 121 to an integer multiple of the reference frequency of the reference signal 101. In order to reduce a frequency of modifying the value represented by the constant signal 162 based on the output value 111, the frequency difference of the first frequency of the first signal 121 to an integer multiple of the reference frequency of the reference signal 101 may be low. That is, the first frequency of the first signal 121 may be very close to an integer multiple of the reference frequency of the reference signal 101. Hence, in some examples, an absolute value of a difference between a ratio of the first frequency to the reference frequency and a ratio of the integer multiple of the reference frequency to the reference frequency may be smaller than 0.4, 0.3, 0.2, 0.1, 0.05, 0.01 or 0.001. Accordingly, the phase difference between the input signal 131 and the reference signal 101 may increase slowly.

The system 100 may comprise one or more additional optional features corresponding to one or more aspects of the proposed concept or one or more examples described below.

Generally speaking, some examples relate to a means for determining a correction for an output value of a TDC within a PLL. The output value relates to a time difference between an input signal and a reference signal supplied to the TDC. The means for determining a correction comprises a means for generating a first signal independently from the output value. The first signal has a first frequency different from an integer multiple of a reference frequency of the reference signal. The means for determining a correction further comprises a means for generating the input signal for the TDC based on the first signal. The input signal has a second frequency being a fraction of the first frequency. The means for determining a correction further comprises a means for calculating the correction using a distribution of output values of multiple time differences.

Some examples relate to a means for modifying an output value of a TDC within a PLL. The output value relates to a time difference between an input signal and a reference signal supplied to the TDC. The means comprises a means for generating a first signal independently from the output value in a first mode of operation of the system. The first signal has a first frequency different from an integer multiple of a reference frequency of the reference signal. Further, the means comprises a means for generating, in the first mode, the input signal for the TDC based on the first signal. The input signal has a second frequency being a fraction of the first frequency. The means further comprises a means for calculating, in the first mode, a correction for the output value using a distribution of output values of multiple time differences. The means for generating a first signal is configured to generate, depending on the output value, a second signal in a second mode of operation of the system. The means for generating the input signal is configured to generate, in the second mode, the input signal based on the second signal, wherein the second frequency is a fraction of the frequency of the second signal. The means further comprises a means for modifying, in the second mode, the output value by the correction. The means may further comprise a means for receiving the correction in the first mode and for supplying the correction to the means for modifying the output value in the second mode.

The means for determining a correction may be implemented by a system for determining a correction for an output signal of a TDC of a PLL described above or below (e.g. FIG. 1). The means for providing a first signal may be implemented by a DCO described above or below (e.g. FIG. 1). The means for providing the input signal may be implemented by a frequency divider described above or below (e.g. FIG. 1). The means for deriving the correction may be implemented by a processing unit described above or below (e.g. FIG. 1). The means for modifying an output value of a TDC within a PLL may be implemented by a system for modifying an output value of a TDC within a PLL described above or below (e.g. FIG. 1 or FIG. 5). The means for modifying the output value by the correction may be implemented by a correction unit described above or below (e.g. FIG. 1 or FIG. 5). The means for receiving and for supplying the correction may be implemented by a look-up table described above or below (e.g. FIG. 1, FIG. 2 or FIG. 5)

Figure 2:
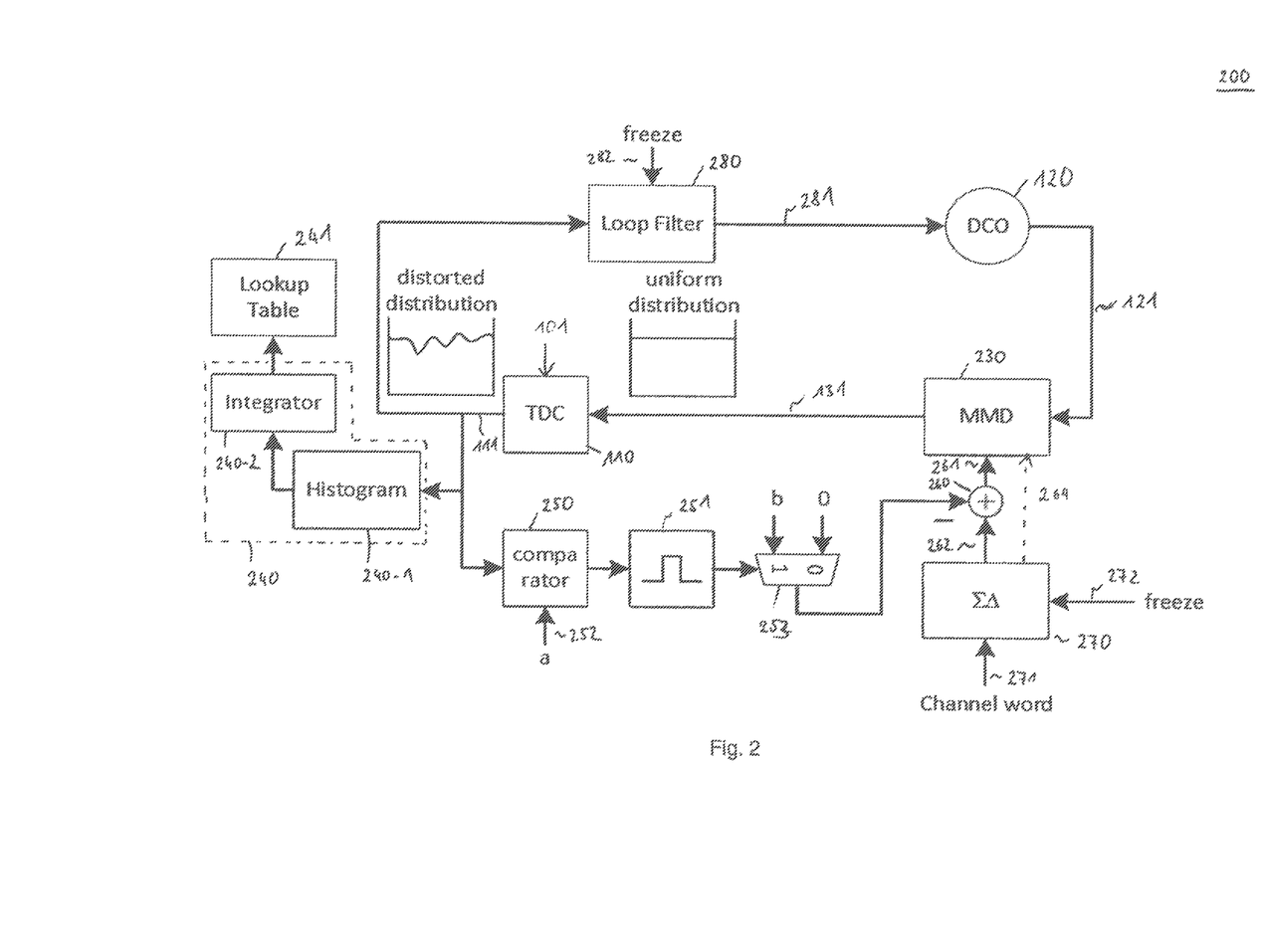
FIG. 2 illustrates another example of a system for determining a correction for an output value of a TDC within a PLL.

FIG. 2 illustrates another example of a system 200 for determining a correction for an output value 111 of a TDC 110 within a (digital) PLL. The output value 111 relates to a time difference between an input signal 131 and a reference signal 101 supplied to the TDC 110.

The TDC 110 generates the output value 111 based on a time difference (phase difference) between the input signal 131 and the reference signal 101. A loop filter 280 (e.g. a low pass filter) receives the output value 111. Based on the output value 111, the loop filter 280 generates a further control signal 281 and provides it to the DCO 120. The DCO 120 generates a first signal 121 having a first frequency which is a multiple of a frequency of the reference signal 101. The first signal 121 is provided to a multi-modulus diver (MMD) 230 serving as frequency divider. The MMD 230 provides the input signal 131 for the TDC 110. The input signal 131 has a second frequency which is a fraction of the first frequency. A ratio of the second frequency to the first frequency is adjusted by the MMD 230 based on a regular control signal 264. The regular control signal 264 is provided to the MMD 230 by a sigma-delta modulator (ΣΔ modulator) 270 based on an input signal (channel word) 271. The ΣΔ modulator 270 provides the digital regular control signal 264 based on the input signal 271 using sigma-delta modulation. The input signal 271 may comprise information on a desired ratio of the first frequency to the reference frequency.

The above configuration of the PLL is operated in regular mode (second mode of operation) to provide the first signal 121 with a first frequency which is different from an integer multiple of the reference frequency 101. As discussed in connection with FIG. 1, it is advantageous to set the first frequency close to an integer multiple of the reference frequency 101.

When the first frequency is set to the desired frequency, e.g., close to an integer multiple of the reference frequency 101 (i.e. a fractional channel of the PLL is set), the PLL is operated in calibration mode (first mode of operation) for determining a correction for the output value 111 of the TDC 110. Therefore, a first freeze signal 282 is provided to the loop filter 280. The first freeze signal 282 causes the loop filter 280 to constantly provide the instantaneous further control signal 281 independently from the output value 111. Hence, the DCO 120 constantly provides the first signal 121 with the first frequency being close to an integer multiple of the reference frequency 101. The first signal 121 is provided independently of the output value 111.

Additionally, a second freeze signal 272 is provided to the ΣΔ modulator 270. The second freeze signal 272 causes the ΣΔ modulator 270 to constantly provide the instantaneous regular signal 264 as constant signal 262 to an adder 260 (serving a signal modification unit) independently from the input signal 271. The regular control signal 264 is no longer provided to the MMD 230. The adder 260 may modify a value represented by the constant signal 262 to provide the control signal 261. Hence, the MMD 230 provides the input signal 131 to the TDC 110 with a constant second frequency. The second frequency is a fixed fraction of the first frequency.

Hence, the PLL is operated in an open loop mode, when the first frequency is set to the desired frequency. As discussed in connection with FIG. 1, the time difference between the input signal 131 and the reference signal 101 changes (e.g. substantially linearly) since the first frequency is different from an integer multiple of the reference frequency. That is, multiple time differences are provided to the TDC 110. A substantially uniform distribution of time differences (phase differences) is provided to the TDC 110. A nonlinearity of the TDC 110 is determined by determining a distribution of output values of the multiple determined time differences. Any deviation from a substantially uniform distribution of the output values 111 characterizes the TDC 110's nonlinearity.

A processing unit 240 is provided to determine a histogram 240-1 of the output values 111 provided by the TDC 110 for the multiple time differences. That is, the output value of the TDC 110 are collected in bins of the histogram 240-1. The bins of the histogram correspond to a predetermined range of the output values. For example, the histogram 240-1 may show a number of occurrences for each output value 111. As discussed in connection with FIG. 1, this distribution may represent a DNL of the TDC 110. In order to calculate the INL (e.g. as correction for an output value of the TDC) the processing unit 240 comprises an integrator 240-2 configured to integrate the distribution of output values (e.g. by integrating the histogram). The determined corrections for the output values of the TDC 110 are stored in a look-up table 241. During regular operation of the PLL (e.g. described in connection with FIG. 5), the PLL may use the determined corrections to correct output values of the TDC 110 for the nonlinearity of the TDC 110.

As discussed in connection with FIG. 1, the time difference between the input signal 131 and the reference signal 101 may be kept within a desired range. Therefore, the system 200 comprises a comparator 250. The comparator 250 compares the output value 111 to a threshold (a) 252. Based on a comparison result 251 of the comparator 250, an offset provision unit 253 supplies an offset value to the adder 260 to linearly modify the value represented by the constant signal 262. For example, the adder 260 may add or subtract the offset value to/from the value represented by the constant signal 262. For example, the offset value may be provided to the adder for one oscillation period of the second frequency (i.e. for the oscillation period of the input signal 131). Accordingly, the control signal 261 may be modified for the one oscillation period of the second frequency, so that the MMD 230 provides the input signal 131 with a different frequency for the one oscillation period of the second frequency. By varying the second frequency of the input signal 131 for a given time period, the time difference between the input signal 131 and the reference signal 101 may be reduced due to the different oscillation period of the input signal 131 during the given time period. Accordingly, the increasing time difference between the input signal 131 and the reference signal 101 may be reduced by one or more oscillation periods of the first frequency.

In other words, the TDC of a divider based digital PLL may be calibrated in order to reduce in-band noise of the PLL. The calibration may start with locking the digital phase-locked loop (DPLL) to a fractional channel which is close to an integer multiple of the reference frequency. The offset to the integer channel may define a slope steepness of the saw tooth phase signal at the TDC input. Once the lock is achieved, the loop filter output and the MMD input may be frozen to their actual values, which may effectively set the PLL to open loop but keep the DCO frequency close to the wanted fractional frequency. Since in this bounded open loop mode the DCO frequency may still be approximately at the fractional channel but the DPLL output phase may no longer be locked to the reference, the TDC input delay may keep changing approximately linearly according to the channel fraction. The inherent noise of the DCO may lead to an additional drift. With a properly chosen fractional channel, the drift rate may be small compared to the ramp due to the channel fraction. In order to keep the TDC input within a defined region, the TDC output may be monitored and compared with a threshold value. If the threshold value is exceeded, the MMD input value may be modified for one cycle by an additive value. This may lead to a jump of the MMD output delay by one or more DCO periods. The jump induced may go in the opposite direction of the slope of the saw tooth signal.

An open loop statistical extraction of the nonlinearity in a divider based PLL may thus be enabled. This may be done by switching the PLL feedback divider in the above defined manner in order to generate a non-drifting saw tooth shaped input signal at the TDC while the PLL is operating in open loop mode. The statistical distribution of the TDC output signal is ideally constant if the TDC is linear, so that any deviation from the constant is due to nonlinearity and can be captured by collecting a histogram The histogram may be collected by counting the number of occurrences of each TDC output value. A linear TDC would result in a flat histogram. A nonlinear TDC may lead to higher probability of TDC output values corresponding to wider delay elements and lower probability for narrower delay elements. So the histogram data may directly show the DNL. The INL may be calculated by integration of the DNL.

The system 200 may comprise one or more additional optional features corresponding to one or more aspects of the proposed concept or one or more examples described below.

Figure 3:
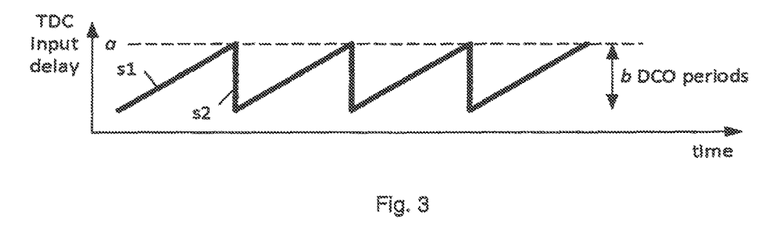
FIG. 3 illustrates an example of a temporal course of a phase difference between a reference signal and an input signal provided to a TDC of a system according to an example described herein.

FIG. 3 illustrates an example of a temporal course of a phase difference between a reference signal and an input signal provided to a TDC of a system according to an example described herein (e.g. illustrated in FIG. 1 or FIG. 2).

The abscissa denotes the time and the ordinate denotes the time difference (phase difference) between the input signal and the reference signal (input delay). The input delay has a saw tooth shape, with two repetitive parts s1 and s2. The slope part s1 represents the increasing time difference related to the frequency difference of the first frequency to an integer multiple of the reference frequency. For an increasing frequency difference between the first frequency and the integer multiple, a slope of the slope part s1 increases.

As discussed in connection with FIG. 1 and FIG. 2, the time differences presented to the TDC may be kept within a defined range. Therefore, the output value of the TDC may be compared to a threshold value. A threshold value a is illustrated in FIG. 3 which indicates the maximum time difference presented to the TDC. Once the maximal time difference is presented to the TDC, the control signal for the frequency divider (e.g. the MMD 230 illustrated in FIG. 2) is modified. For example, a value represented by the control signal is increased or decreased by an offset value b for one oscillation period of the second frequency. Accordingly, the second frequency of the input signal for the TDC is modified (increased or decreased) for this time period. The temporarily modified frequency of the input signal for the TDC causes a reduction of the time difference between the input signal and the reference signal. The reduction of the time difference is illustrated by part s2 in FIG. 3. For example, decreasing the value represented by the control signal by an offset value b for one oscillation period of the first frequency may reduce the time difference between the input signal and the reference signal by b oscillation periods of the first frequency since the oscillation period of the second frequency is temporarily smaller due to the modified control signal. Accordingly, periodically modifying the control signal for the frequency divider may allow to effectively keep the time differences presented to the TDC within a defined range.

FIG. 3 illustrates a situation where the first frequency is slightly lower than an integer multiple of the reference frequency, therefore the control signal for the frequency divider is modified if the output value (representing the time difference) exceeds the threshold a. For example, if the first frequency is slightly higher than the integer multiple of the reference frequency, a slope of slope part s1 would be inverse, so that the control signal for the frequency divider would be modified if the output value (representing the time difference) falls below a threshold.

In other words, an exemplary waveform of the TDC input signal is shown in FIG. 3. The saw tooth may have two repetitive parts—s1 and s2. The slope part s1 may be defined by the DCO frequency which has a small offset to the next integer multiple of the reference frequency. In order to keep the TDC input within a defined region, the TDC output may be monitored and compared with a threshold value a. If the threshold value is exceeded, the MMD input value may be modified for one cycle by an additive value b. That is, once the level a is reached, the MMD divider value may be modified for one cycle leading to a shift of the input delay by b DCO periods. a and b may be chosen to capture the wanted region of the TDC. For example, if the DPLL is using a 3rd order $\Sigma\Delta$ modulator at the MMD input, the resulting delay variation at the TDC input may be +/−2 DCO periods relative to a constant offset. So b might be set to 4 and a might be set to the equivalent value of 2 DCO periods plus the constant offset. This may lead to a jump of the MMD output delay by b DCO periods. The jump induced may go in the opposite direction of the slope of the saw tooth signal.

Figure 4:
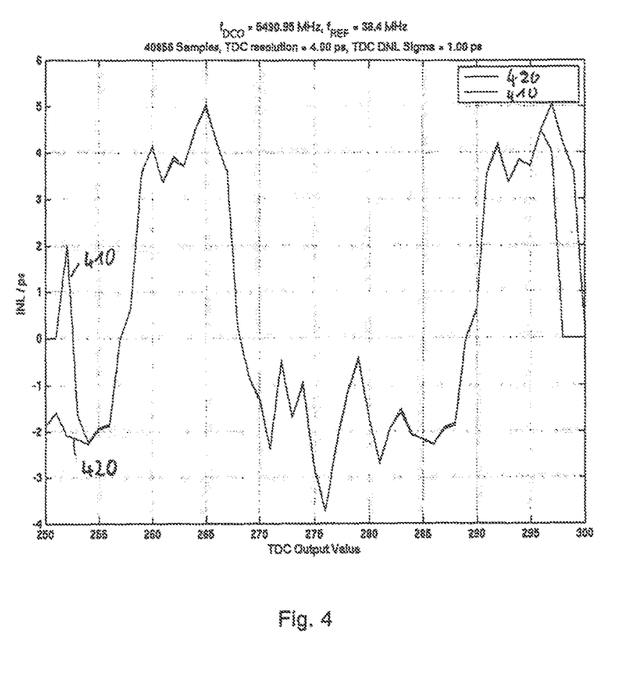
FIG. 4 illustrates an example of a correction for an output value of a TDC within a PLL.

FIG. 4 illustrates an example of a correction for an output value of a TDC of a PLL. In particular, FIG. 4 illustrates a comparison between an INL 410 of the TDC determined according to the proposed concept and a simulated INL 420 of the TDC. The abscissa denotes output values of the TDC and the ordinate denotes the INL for the specific output value. The abscissa regions at the edge of the diagram illustrate output values of the TDC related to maximum and minimum time differences presented to the TDC (e.g. illustrated in FIG. 3 as peak and valley of the temporal course).

As discussed in connection with FIG. 1, the INL describes the actual deviation of a quantized value from an ideal value. FIG. 4 illustrates that the INL 410 determined according to proposed concept matches closely to the simulated INL 420. The slight deviation at the edges of the diagram results from the sudden change of the time difference at the minimum and the maximum time difference due to the modification of the control signal for the frequency divider. In other words, it may be seen that within a defined range given by chosen values of a and b the captured INL matches closely the modeled INL.

Figure 5:
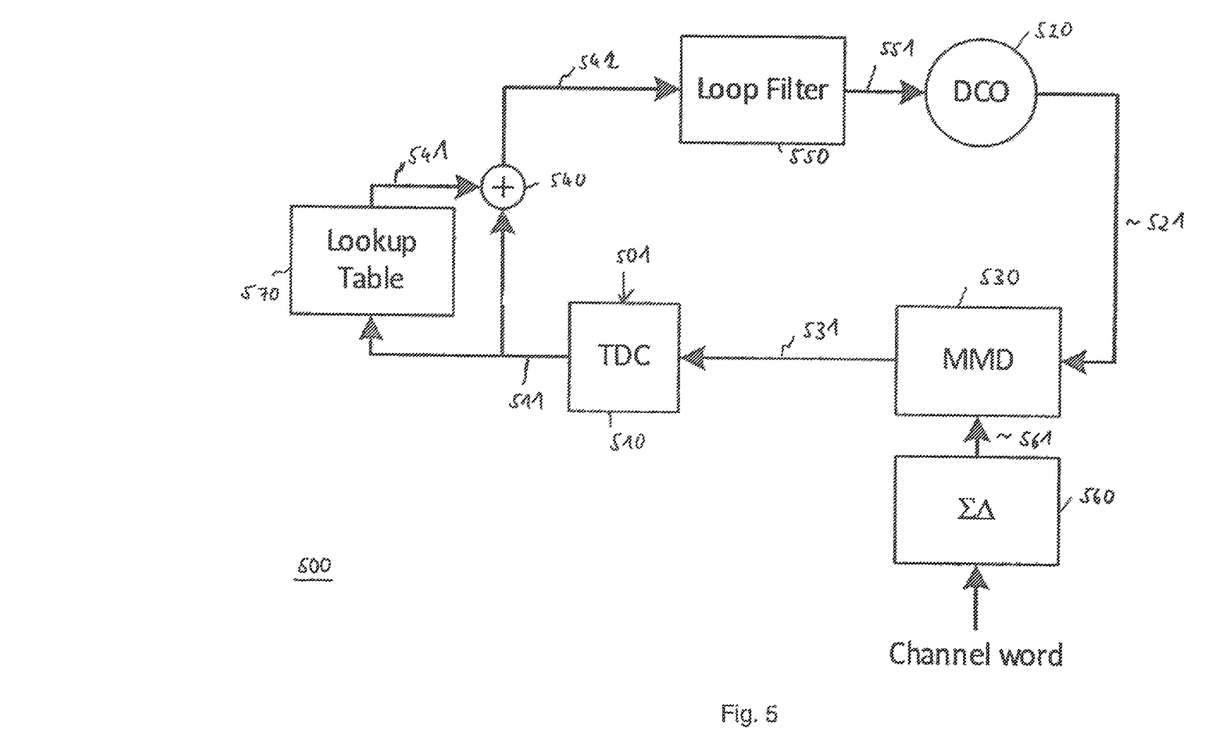
FIG. 5 illustrates an example of a PLL using a correction for an output value of its TDC.

FIG. 5 illustrates an example of a PLL 500 using a correction, which is determined according to an example described herein, for an output signal 511 of its TDC 510.

The PLL 500 comprises a DCO 520 providing a PLL output signal 521. The PLL output signal 521 is provided to a MMD 530. The MMD 530 provides an input signal 531 for the TDC 510 based on the PLL output signal 521 and a digital control signal 561 provided by a $\Sigma\Delta$ modulator 560. The $\Sigma\Delta$ modulator 560 provides the digital control signal 561 to the MMD 530 based on a channel word. The channel word comprises information related to a desired ratio of a frequency of the PLL output signal 521 to a reference frequency of a reference signal 501 provided to the TDC 510. The MMD 530 provides the input signal 531 with a frequency which is a fraction of the frequency of the PLL output signal 521 based on the control signal 561.

The TDC 510 compares a phase of the input signal 531 to a phase of the reference signal 501, i.e., the TDC 510 determines a time difference between the input signal 531 and the reference signal 501. Based on the phase difference between the input signal 531 and the reference signal 501, the TDC 510 provides a digital signal 511 representing a digital value which indicates the phase difference. Due to a nonlinearity of the TDC 510, the value represented by the digital signal 511 may be distorted, i.e., the digital signal 511 may contain noise.

The digital signal 511 is provided to an adder 540. The adder 540 modifies the value represented by the digital signal 511. For example, the adder may linearly modify (e.g. add or subtract) the value represented by the digital signal 511 by a correction 541 in order to provide the corrected output signal 542. The correction is provided by a look-up table 570 to the adder 540. The correction 541 provided by the look-up table 570 is determined according to one or more aspects of the proposed concept or one or more examples described above or below. Hence, the correction 541 may allow to reduce noise related to the nonlinearity of the TDC 510 in the output signal 511 very precisely. The corrected output signal 542 is provided to a loop filter 550, which provides a further control signal 551 to the DCO 520 based on the corrected output signal 542.

Since the noise related to the nonlinearity of the TDC 510 may be effectively reduced by the correction 541, which is determined according to the proposed concept, the corrected output signal 542 may contain less noise than a hypothetic corrected output signal which was generated by using a correction determined according to conventional approaches. Accordingly, the loop filter 550 provides a further control signal 551 to the DCO 520 which may contain less noise. Hence, the DCO 520 may provide the PLL output signal 521 with higher quality. For example, the PLL 500 may output a radio frequency signal of high quality.

Figure 6:
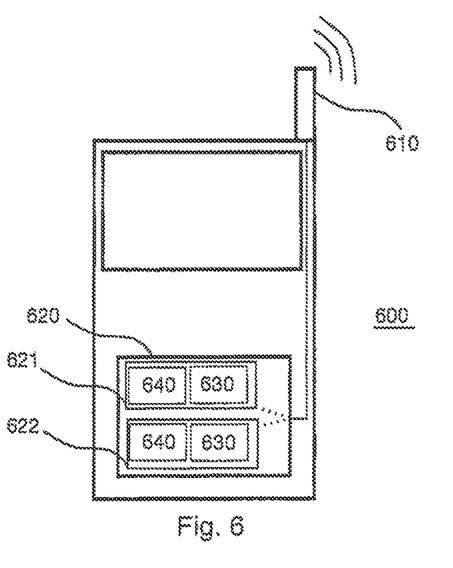
FIG. 6 illustrates an example of a mobile communications device comprising a system for determining a correction for an output value of a TDC within a PLL or a system for modifying an output value of a TDC within a PLL.

An example of an implementation using correction determination for an output value of a TDC within a PLL according to one or more aspects of the proposed concept or one or more examples described above is illustrated in FIG. 6. FIG. 6 schematically illustrates an example of a mobile communications device or mobile phone or user equipment 600 comprising a system 630 for determining a correction for an output value of a TDC within a PLL according to an example described herein, or a system 640 for modifying an output value of a TDC within a PLL according to an example described herein. The system 630 or the system 640 may be comprised in a transmitter 621. Alternatively or additionally, the system 630 or the system 640 may be comprised in a receiver 622. The transmitter 621 and/or the receiver 622 may be comprised in a transceiver 620. An antenna element 610 of the mobile communications device 600 may be coupled to the transceiver 620 or to the transmitter 621 and/or the receiver 622, respectively. To this end, mobile communications devices may be provided allowing to generate radio frequency signals of high quality by means of a PLL.

Figure 7:
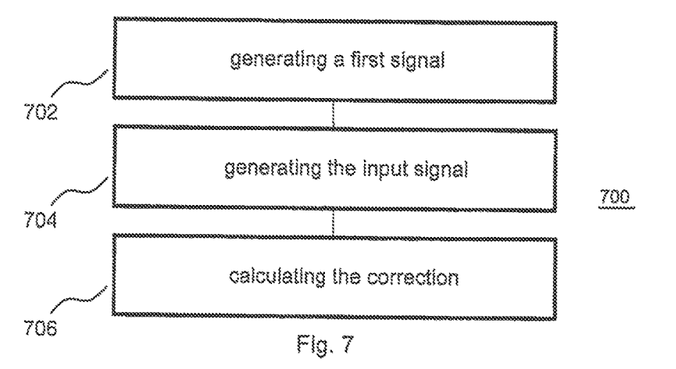
FIG. 7 illustrates a flowchart of an example of a method for determining a correction for an output value of a TDC within a PLL.

An example of a method 700 for determining a correction for an output value of a TDC within a PLL is illustrated by means of a flowchart in FIG. 7. The output value is related to a time difference between an input signal and a reference signal. The method comprises generating 702 a first signal independently from the output value. The first signal has a first frequency different from an integer multiple of a reference frequency of the reference signal. Further, the method comprises generating 704 the input signal for the TDC based on the first signal. The input signal has a second frequency being a fraction of the first frequency. The method further comprises calculating 706 the correction using a distribution of output values of multiple time differences.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

Figure 8:
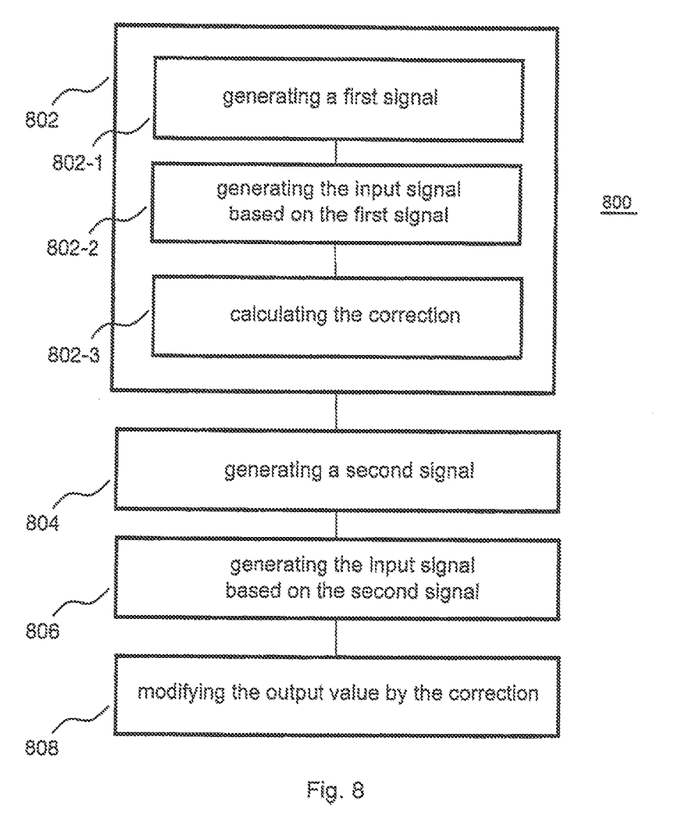
FIG. 8 illustrates a flowchart of an example of a method for modifying an output value of a TDC within a PLL.

An example of a method 800 for modifying an output value of a TDC within a PLL is illustrated by means of a flowchart in FIG. 8. The output value is related to a time difference between an input signal and a reference signal. The method comprises calculating 802 a correction for the output value in a first mode of operation. Calculating 802 the correction comprises generating (802-1) a first signal independently from the output value. The first signal has a first frequency different from an integer multiple of a reference frequency of the reference signal. Further, calculating 802 the correction comprises generating 802-2 the input signal for the TDC based on the first signal. The input signal has a second frequency being a fraction of the first frequency. Calculating 802 the correction further comprises calculating 802-3 the correction using a distribution of output values of multiple time differences. The method further comprises generating 804, depending on the output value, a second signal in a second mode of operation. Further, the method comprises generating 806, in the second mode, the input signal based on the second signal. The second frequency is a fraction of the frequency of the second signal. The method comprises further modifying 808, in the second mode, the output value by the correction.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

The examples as described herein may be summarized as follows:

Example 1 is a system for determining a correction for an output value of a time-to-digital converter within a phase-locked loop, the output value relating to a time difference between an input signal and a reference signal supplied to the time-to-digital converter, comprising: a digitally-controlled oscillator configured to generate a first signal independently from the output value, wherein the first signal has a first frequency different from an integer multiple of a reference frequency of the reference signal; a frequency divider configured to generate the input signal for the time-to-digital converter based on the first signal, wherein the input signal has a second frequency being a fraction of the first frequency; and a processing unit configured to calculate the correction using a distribution of output values of multiple time differences.

In example 2, the frequency divider in the system of example 1 is configured to select a ratio of the second frequency to the first frequency based on a control signal, and the control signal is based on the output value.

In example 3, the system of example 2 further comprises: a comparator configured to compare the output value to a threshold; and a signal modification unit configured to modify a constant signal based on a comparison result of the comparator to provide the control signal.

In example 4, the signal modification unit in the system of example 3 is configured to linearly modify a value represented by the constant signal by an offset value for an oscillation period of the input signal.

In example 5, the system of example 4 further comprises an offset provision unit configured to supply the offset value to the signal modification unit based on the comparison result of the comparator.

In example 6, the frequency divider in the system of example 3, example 4 or example 5 comprises a multi-modulus divider, and the system further comprises a sigma-delta modulator configured to generate the constant signal independently from a second input signal provided to the sigma-delta modulator.

In example 7, an absolute value of a difference between a ratio of the first frequency to the reference frequency and a ratio of the integer multiple of the reference frequency to the reference frequency is smaller than about 0.05 in the system of any of the preceding examples.

In example 8, the processing unit in the system of any of the preceding examples comprises an integrator configured to integrate the distribution of output values.

In example 9, the processing unit in the system of example 9 is further configured to collect the distribution of output values in bins of a histogram, the bins corresponding to a predetermined range of the output values, and the integrator is further configured to integrate contents of the bins.

In example 10, the system in the system of any of the preceding examples further comprises a loop filter configured to receive the output value, and wherein the loop filter is further configured to generate a further control signal for the digitally-controlled oscillator independently from the output value.

Example 12 is a system for modifying an output value of a time-to-digital converter within a phase-locked loop, the output value relating to a time difference between an input signal and a reference signal supplied to the time-to-digital converter, comprising: a digitally-controlled oscillator configured to generate a first signal independently from the output value in a first mode of operation, wherein the first signal has a first frequency different from an integer multiple of a reference frequency of the reference signal; a frequency divider configured to generate, in the first mode, the input signal for the time-to-digital converter based on the first signal, wherein the input signal has a second frequency being a fraction of the first frequency; a processing unit configured to calculate, in the first mode, a correction for the output value using a distribution of output values of multiple time differences, wherein the digitally-controlled oscillator is configured to generate, depending on the output value, a second signal in a second mode of operation, wherein the frequency divider is configured to generate, in the second mode, the input signal based on the second signal, wherein the second frequency is a fraction of the frequency of the second signal; and a correction unit configured to modify, in the second mode, the output value by the correction.

In example 12, the system of example 11 further comprises a loop-up table configured to receive, in the first mode, the correction and to supply, in the second mode, the correction to the correction unit.

Example 13 is a transmitter comprising a system for determining a correction for an output signal of a time-to-digital converter within a phase-locked loop according to any of examples 1 to 10/or a system for modifying an output value of a time-to-digital converter within a phase-locked loop according to any of examples 11 and 12.

Example 14 is a receiver comprising a system for determining a correction for an output signal of a time-to-digital converter within a phase-locked loop according to any of examples 1 to 10/or a system for modifying an output value of a time-to-digital converter within a phase-locked loop according to any of examples 11 and 12.

Examples 15 is a mobile communications device comprising a transmitter according to example 13 and/or a receiver according to example 14.

In example 16, the mobile communications device of example 15 further comprises at least one antenna coupled to the transmitter and/or the receiver.

Example 17 is a means for determining a correction for an output value of a time-to-digital converter within a phase-locked loop, the output value relating to a time difference between an input signal and a reference signal supplied to the time-to-digital converter, comprising: a means for generating a first signal independently from the output value, wherein the first signal has a first frequency different from an integer multiple of a reference frequency of the reference signal; a means for generating the input signal for the time-to-digital converter based on the first signal, wherein the input signal has a second frequency being a fraction of the first frequency; a means for calculating the correction using a distribution of output values of multiple determined time differences.

In example 18, the means for providing the input signal in the means of example 17 is configured to select a ratio of the second frequency to the first frequency based on a control signal, and wherein the control signal is based on the output value.

Example 19 is a means for modifying an output value of a time-to-digital converter within a phase-locked loop, the output value relating to a time difference between an input signal and a reference signal supplied to the time-to-digital converter, comprising: a means for generating a first signal independently from the output value in a first mode of operation of the system, wherein the first signal has a first frequency different from an integer multiple of a reference frequency of the reference signal; a means for generating, in the first mode, the input signal for the time-to-digital converter based on the first signal, wherein the input signal has a second frequency being a fraction of the first frequency; a means for calculating, in the first mode, a correction for the output value using a distribution of output values of multiple time differences, wherein the means for generating a first signal is configured to generate, depending on the output value, a second signal in a second mode of operation of the system, wherein the means for generating the input signal is configured to generate, in the second mode, the input signal based on the second signal, wherein the second frequency is a fraction of the frequency of the second signal; and a means for modifying, in the second mode, the output value by the correction.

In example 20, the means of example 19 further comprises a means for receiving the correction in the first mode and for supplying the correction to the means for modifying the output value in the second mode.

Example 21 is a method for determining a correction for an output value of a time-to-digital converter within a phase-locked loop, the output value relating to a time difference between an input signal and a reference signal supplied to the time-to-digital converter, comprising: generating a first signal independently from the output value, wherein the first signal has a first frequency different from an integer multiple of a reference frequency of the reference signal; generating the input signal for the time-to-digital converter based on the first signal, wherein the input signal has a second frequency being a fraction of the first frequency; and calculating the correction using a distribution of output values of multiple time differences.

In example 22, generating the input signal for the time-to-digital converter in the method of example 21 comprises selecting a ratio of the second frequency to the first frequency based on a control signal, and wherein the control signal is based on the output value.

In example 23, generating the input signal in the method of example 22 comprises: comparing the output value to a threshold; and modifying a constant signal based on a comparison result to provide the control signal.

In example 24, modifying the constant signal in the method of example 23 comprises linearly modifying a value represented by the constant signal by an offset value for an oscillation period of the input signal.

In example 25, an absolute value of a difference between a ratio of the first frequency to the reference frequency and a ratio of the integer multiple of the reference frequency to the reference frequency is smaller than about 0.05 in the method of any of the preceding examples.

In example 26, calculating the correction in the method of any of the preceding examples comprises integrating the distribution of output values.

In example 27, integrating the distribution of output values in the method of example 26 comprises: collecting the distribution of output values in bins of a histogram, the bins corresponding to a predetermined range of output values; and integrating contents of the bins.

Example 28 is a method for modifying an output value of a time-to-digital converter within a phase-locked loop, the output value relating to a time difference between an input signal and a reference signal supplied to the time-to-digital converter, comprising: calculating a correction for the output value in a first mode of operation, wherein calculating the correction comprises: generating a first signal independently from the output value, wherein the first signal has a first frequency different from an integer multiple of a reference frequency of the reference signal; generating the input signal for the time-to-digital converter based on the first signal, wherein the input signal has a second frequency being a fraction of the first frequency; calculating the correction using a distribution of output values of multiple time differences; and generating, depending on the output value, a second signal in a second mode of operation; generating, in the second mode, the input signal based on the second signal, wherein the second frequency is a fraction of the frequency of the second signal; and modifying, in the second mode, the output value by the correction.

Example 29 is a computer readable storage medium having stored thereon a program having a program code for performing the method of any of examples 21 to 28, when the program is executed on a computer or processor.

Example 30 is a computer program having a program code configured to perform the method of any of examples 21 to 28, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A system for determining a correction for an output value of a time-to-digital converter within a phase-locked loop, the output value relating to a time difference between an input signal and a reference signal supplied to the time-to-digital converter, comprising:
    a digitally-controlled oscillator configured to generate a first signal independently from the output value, wherein the first signal has a first frequency different from an integer multiple of a reference frequency of the reference signal;
    a frequency divider configured to generate the input signal for the time-to-digital converter based on the first signal, wherein the input signal has a second frequency being a fraction of the first frequency; and
    a processing unit configured to calculate the correction using a distribution of output values of multiple time differences.

2. The system of claim 1, wherein the frequency divider is configured to select a ratio of the second frequency to the first frequency based on a control signal, and wherein the control signal is based on the output value.

3. The system of claim 2, wherein the system further comprises:
    a comparator configured to compare the output value to a threshold; and
    a signal modification unit configured to modify a constant signal based on a comparison result of the comparator to provide the control signal.

4. The system of claim 3, wherein the signal modification unit is configured to linearly modify a value represented by the constant signal by an offset value for an oscillation period of the input signal.

5. The system of claim 4, further comprising an offset provision unit configured to supply the offset value to the signal modification unit based on the comparison result of the comparator.

6. The system of claim 3, wherein the frequency divider comprises a multi-modulus divider, and wherein the system further comprises a sigma-delta modulator configured to generate the constant signal independently from a second input signal provided to the sigma-delta modulator.

7. The system of claim 1, wherein an absolute value of a difference between a ratio of the first frequency to the reference frequency and a ratio of the integer multiple of the reference frequency to the reference frequency is smaller than about 0.05.

8. The system of claim 1, wherein the processing unit comprises an integrator configured to integrate the distribution of output values.

9. The system of claim 8, wherein the processing unit is further configured to collect the distribution of output values in bins of a histogram, the bins corresponding to a predetermined range of the output values, and wherein the integrator is further configured to integrate contents of the bins.

10. The system of claim 1, wherein the system further comprises a loop filter configured to receive the output value, and wherein the loop filter is further configured to generate a further control signal for the digitally-controlled oscillator independently from the output value.

11. A system for modifying an output value of a time-to-digital converter within a phase-locked loop, the output value relating to a time difference between an input signal and a reference signal supplied to the time-to-digital converter, comprising:
a digitally-controlled oscillator configured to generate a first signal independently from the output value in a first mode of operation, wherein the first signal has a first frequency different from an integer multiple of a reference frequency of the reference signal;
a frequency divider configured to generate, in the first mode, the input signal for the time-to-digital converter based on the first signal, wherein the input signal has a second frequency being a fraction of the first frequency;
a processing unit configured to calculate, in the first mode, a correction for the output value using a distribution of output values of multiple time differences,
wherein the digitally-controlled oscillator is configured to generate, depending on the output value, a second signal in a second mode of operation,
wherein the frequency divider is configured to generate, in the second mode, the input signal based on the second signal, wherein the second frequency is a fraction of the frequency of the second signal; and
a correction unit configured to modify, in the second mode, the output value by the correction.

12. The system of claim 11, further comprising a loop-up table configured to receive, in the first mode, the correction and to supply, in the second mode, the correction to the correction unit.

13. A method for determining a correction for an output value of a time-to-digital converter within a phase-locked loop, the output value relating to a time difference between an input signal and a reference signal supplied to the time-to-digital converter, comprising:
generating a first signal independently from the output value, wherein the first signal has a first frequency different from an integer multiple of a reference frequency of the reference signal;
generating the input signal for the time-to-digital converter based on the first signal, wherein the input signal has a second frequency being a fraction of the first frequency; and
calculating the correction using a distribution of output values of multiple time differences.

14. The method of claim 13, wherein generating the input signal for the time-to-digital converter comprises selecting a ratio of the second frequency to the first frequency based on a control signal, and wherein the control signal is based on the output value.

15. The method of claim 14, wherein generating the input signal comprises:
comparing the output value to a threshold; and
modifying a constant signal based on a comparison result to provide the control signal.

16. The method of claim 15, wherein modifying the constant signal comprises linearly modifying a value represented by the constant signal by an offset value for an oscillation period of the input signal.

17. The method of claim 13, wherein an absolute value of a difference between a ratio of the first frequency to the reference frequency and a ratio of the integer multiple of the reference frequency to the reference frequency is smaller than about 0.05.

18. The method of claim 13, wherein calculating the correction comprises integrating the distribution of output values.

19. The method of claim 18, wherein integrating the distribution of output values comprises:
collecting the distribution of output values in bins of a histogram, the bins corresponding to a predetermined range of output values; and
integrating contents of the bins.

20. A method for modifying an output value of a time-to-digital converter within a phase-locked loop, the output value relating to a time difference between an input signal and a reference signal supplied to the time-to-digital converter, comprising:
calculating a correction for the output value in a first mode of operation, wherein calculating the correction comprises:
generating a first signal independently from the output value, wherein the first signal has a first frequency different from an integer multiple of a reference frequency of the reference signal;
generating the input signal for the time-to-digital converter based on the first signal, wherein the input signal has a second frequency being a fraction of the first frequency;
calculating the correction using a distribution of output values of multiple time differences;
generating, depending on the output value, a second signal in a second mode of operation;
generating, in the second mode, the input signal based on the second signal, wherein the second frequency is a fraction of the frequency of the second signal; and
modifying, in the second mode, the output value by the correction.

* * * * *